United States Patent [19]

Lee et al.

[11] Patent Number: 5,665,791
[45] Date of Patent: Sep. 9, 1997

[54] PHOTOSENSITIVE POLYMER FILMS AND THEIR METHOD OF PRODUCTION

[75] Inventors: Chung J. Lee; Jahja I. Trisnadi, both of Austin, Tex.

[73] Assignee: Tamarack Storage Devices, Inc., Austin, Tex.

[21] Appl. No.: 531,521

[22] Filed: Sep. 21, 1995

[51] Int. Cl.$^6$ .................. C08F 2/46; G03H 1/04
[52] U.S. Cl. .................. 522/25; 522/26; 522/31; 522/120; 522/121; 522/122; 522/142; 522/143; 522/144; 430/2; 430/281.1
[58] Field of Search .................. 522/120, 121, 522/122, 25, 26, 31, 142, 143, 144; 430/2, 281.1

[56] References Cited

U.S. PATENT DOCUMENTS

| | | | |
|---|---|---|---|
| 4,588,664 | 5/1986 | Fielding et al. | 522/120 |
| 4,696,876 | 9/1987 | Cael | 522/120 |
| 5,077,370 | 12/1991 | Lee | 528/26 |
| 5,453,340 | 9/1995 | Kawabata et al. | 430/2 |

Primary Examiner—Mark Chapman
Attorney, Agent, or Firm—Baker & Botts, L.L.P.

[57] ABSTRACT

Novel photosensitive polymer films are provided that include (1) a polymer carrier having =N—C(=O)— groups; (2) an initiation system for photo polymerization; (3) polymerizable compounds; and (4) other chemicals as appropriate. The photosensitive polymer films demonstrate short pump times, short DRAW times, short fix times, and reduced noise levels equal to one-third to one-fifth the noise level of prior photosensitive polymer films.

20 Claims, No Drawings

PHOTOSENSITIVE POLYMER FILMS AND THEIR METHOD OF PRODUCTION

TECHNICAL FIELD OF THE INVENTION

The present invention relates to photosensitive polymer films and, more particularly, to photosensitive polymer films that provide holographic media that are highly sensitive and that have, short grating formation time, hence short DRAW direct read after write (DRAW) times and low noise for effective use in a variety of write-once-read-many (WORM) and other types of holographic storage applications.

BACKGROUND OF THE INVENTION

The chemistries for making photosensitive polymers for holographic applications have been demonstrated, at least to some degree, since approximately 1970. In fact, as a general principle a wide variety of photosensitive compositions may form a photosensitive polymer film that is be useful for making holograms. Photosensitive polymer films useful for holographic applications include ingredients such as a polymer carrier that may be a film-forming polymer, one or more photosensitive initiators, dyes or sensitizers, and different types of photoreactive compounds. To be useful for holographic storage applications, however, photosensitive polymer films must satisfy certain functional requirements.

An example of these requirements is that polymerization of the photosensitive polymer films during light exposure must be substantially completed in no more than a few hundred $mJ/cm^2$. There is also a trade-off between film sensitivity and the material properties of the film. Although high sensitivity may yield higher grating intensity in a short period of time, high sensitivity of the photosensitive polymer film may affect other chemical and physical characteristics.

One characteristic to consider in forming a photosensitive polymer film is that the refractive index of the polymer carrier and that of the polymers newly formed by the reactive ingredients must be substantially different. Also, during polymerization, monomers must sufficiently diffuse from the dark fringes to the bright fringes of the film, while most other reactive species must stay in the bright zones of the film. Furthermore, noises created from scatter centers and arising from either electronic or morphological heterogeneities in the film must be significantly lower than is often obtainable.

Physical properties that govern the use of photosensitive polymers include the requirement that during and after polymerization the physical dimension of the films must remain largely unchanged. In addition, while photosensitive polymer films, on the one hand, must be sensitive to light, they must, on the other hand, be thermally stable at temperatures as high as 55° C. for several years. Finally, in order to be useful for most applications, photosensitive polymers must store holograms fixed and stable under ambient conditions of 60° C. and 95% relative humidity for at least 2000 hours.

Photosensitive polymer compositions that satisfy the above criteria may be classified according to the initiators used in the films. Two known classifications of polymers are (1) free radical initiator photosensitive polymers, and (2) cationic initiator photosensitive polymers. There are two types of free radical initiators: Type I and Type II. Type I initiators can generate free radicals upon absorption of photons or through excitation of exposed sensitizers. Examples of Type I free radical initiators are the following:

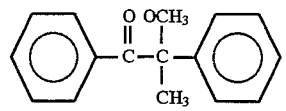

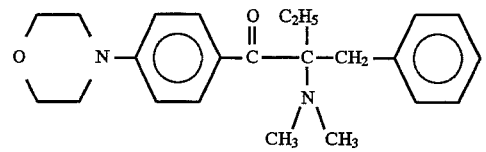

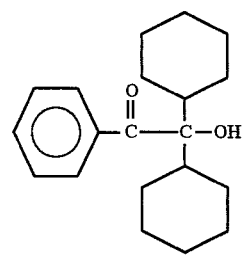

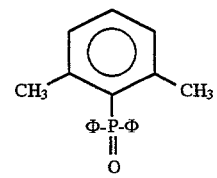

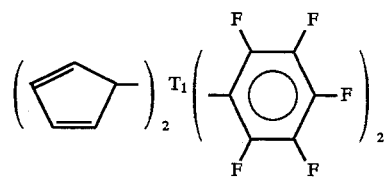

Upon absorption of photons or through excitation of sensitizers, the excited states of Type II photosensitive initiators, on the other hand, abstract an alpha hydrogen molecule from a tertiary amine. This generates free radicals for polymerization of vinyl or acrylates. Examples of Type II free radical initiators take the following form:

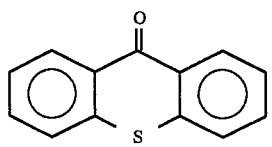

The above two types (i.e., Type I and Type II) of free radical initiators are useful for polymerization of acrylates and vinyl monomers. To maintain thermal stability, inhibitors are normally added to these monomers. Adding inhibitors helps to prevent premature thermal polymerization during film storage. In addition, a barrier film often covers the photosensitive polymer films. The barrier film prevents oxygen inhibition that may occur to the free radicals that arise from photoexposure of the film.

Because of the need to address these physical constraints, photosensitive polymer films that include free radical initiators are slow to respond to light exposure. The delays include an induction time delay or the time delay of a pre-pump stage, which must occur before it is possible to record on the film. In addition, during the pre-pump stage, pre-pump energy must generate sufficient free radicals to overcome pre-dissolved oxygen and inhibitors that exist in the films. Current commercial films of this type require more than 100 to 200 mJ/cm² of pre-pump energy to even begin the recording process. As a practical matter, therefore, these films are not suitable for most holographic data storage applications.

Other types of photosensitive polymer films use cationic initiators. For example, since 1970 cationic initiators such as iodonium and sulfonium salts have been used to polymerize vinyl ethers, cyclic ethers and acetals and epoxies. These cationic initiators generate cationic species which are not sensitive to the oxygen. These cationic species, however, can be poisoned by active amino-hydrogen of the primary or secondary amino compounds such as the following:

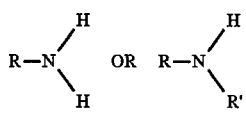

When they are free from the above active hydrogen, the cationic species can have very long life and cause dark reactions. The long life cationic species are undesirable for making high density gratings in holographic application. This is because the cationic species can diffuse into dark fringes, reduce grating intensity or widen gratings over time. In addition, the cationic polymerization rate, in general, is very slow compared to the polymerization rate of the free radicals.

Since most traditional photosensitive initiators are not absorbing enough in the 685 nm±5 nm ranges, dyes or photosensitizers are normally added all the above initiators. Dyes are chosen (1) if they have high absorption at 685 nm, (2) if they can be bleached by the presence of photosensitive initiators during exposure, and (3) if their quantum yield or efficiency of bleaching upon exposure is high.

Adding dyes produces yet another chemical consideration in photosensitive films. In general, the energy gap between the excited state of the dye and the excited state of the photo-initiators have to be in the order of few Kcal/Mol to provide an effective quantum yield.

SUMMARY OF THE INVENTION

Accordingly, the present invention provides novel photosensitive polymers films that substantially eliminate or reduce disadvantages and limitations associated with previously developed photosensitive polymers films to satisfy the above-stated needs.

Novel holographic photosensitive polymers consist of three essential ingredients and fourth class of other chemicals. These include (I) a polymer carrier having =N—C(=O)— groups; (II) an initiation system for photopolymerization; (III) some polymerizable compounds and (IV) other chemicals. The photosensitive polymer compositions and films resulting from these compositions that the present invention produces are prepared from the above-stated ingredients.

A technical advantage of the present invention is that the resulting photosensitive polymer films require Very short pump fluence of between approximately 5 to 15 mJ/cm² compared to traditional acrylate based photosensitive polymers which required more than 100 mJ/cm² of pump fluence.

Another technical advantage that the present invention is that the resulting photosensitive polymer films have short DRAW times that are on the order of 50 msec. compared to the traditional photosensitive polymers that are based on acrylates and which lave DRAW times of more than 5 to 10 sec.

Yet another technical advantage of the present invention is that the resulting photosensitive polymer films have short fix time in the order of few seconds compared to 20 to 30 seconds, or more than 10,000 mJ/cm² of fixing fluence of the traditional photosensitive polymer films based on acrylates.

Still another technical advantage of the present invention is that the resulting photosensitive polymer films produce a noise level that is equal to one-third to one-fifth of the noise levels existing in traditional photosensitive polymer films that are based on acrylates.

DETAILED DESCRIPTION OF THE INVENTION

I. The Polymer Carrier

The polymer carrier has a generic structure consisting of =N—C(=O)— groups. The polymer carrier serves primarily as a film-forming ingredient. However, to make useful photosensitive polymer films for holographic storage applications, the polymer carrier should provide interactions for the polymer carrier and chemicals in the initiating system, as well as the polymerizable compounds and possibly other chemicals present in the resulting photosensitive polymer films.

For the present embodiments of the invention, two useful polymers are chosen that are readily dissolved in low boiling solvents such as MEK and Ethanol. The chosen polymers are Poly (2-ethyl-2-oxazoline) and Polyvinylpyrrolidone with the following structures:

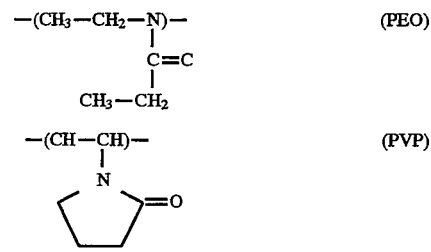

The above polymers are specifically chosen and optimized for all the following other ingredients. Replacement of the above polymers consisting of =N—C(=O) groups with other polymers, will be significantly reduced, both the sensitivity and dynamic range of the photosensitive polymers.

Polymer carriers that have been examined for purposes of the present invention include PMMA, PS, PVOH, PVAc, PEO, PVP, PVC (Polyvinylcarbazole) and PEI (Polyethylene imines).

II. The Initiating System

The initiating system for use in forming the photosensitive polymers of the present invention include the essential ingredients (A) a dye or sensitizer and (B) one or more photosensitive initiators as herein described.

A dye or sensitizer that achieves the purposes of the present invention should absorb primarily in the range of 700±30 nm or preferably have the maximum of absorption at 685 nm. Two most efficient dyes for the purposes of the present invention have the following chemical structures:

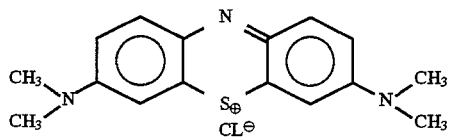

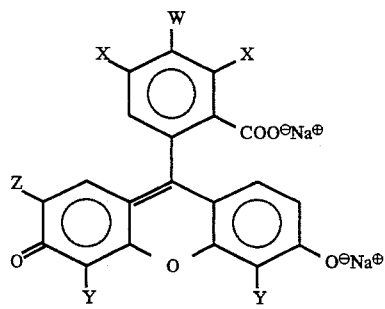

Other dyes that are examined include Acid black 48, Luxo fast Blue, Prussian blue, acid green 41, Neozapon, and Flexo Blue.

Photosensitive initiators for use with the present invention generate reactive species upon interactions with excited dye molecules. Two highly desirable initiators used for the present invention are shown below with labels I2 and I3.

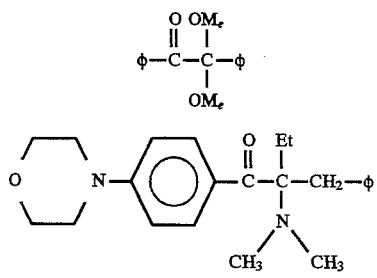

The best co-initiator which can be used for these initiators is an amino acid with the following structure:

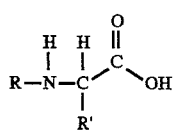

FOR EXAMPLES:

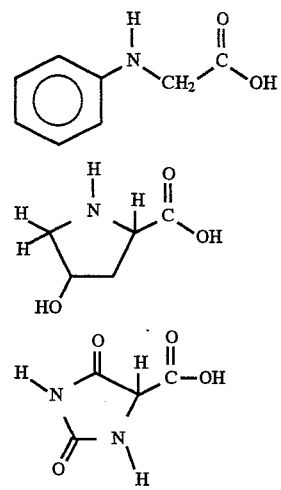

Amino acids that have been tested are amino acids including (1) the primary amine: Glycine; (2) the secondary amine: NPG and TRICINE; (3) the tertiary amine: BICINE; (4) the amido amine: GlyGly. Acids tested include (1) Poly AMPSA and Acrylic acid, and (2) ADA. Secondary Amines that have been tested include (1) Carbazole, (2) Tetraethyl guadinine, (3) Corcat 600E (PEI).

Additionally, some iodonium salts or sulfonium salts which are traditionally used for photo-polymerization of epoxies can be very useful for increasing photosensitivity and stabilization of gratings. The best salts are S4, S5 and S6 of the following chemical structures:

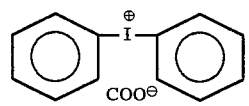
S4

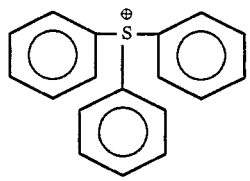
S5

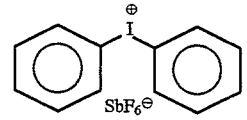
S6

Cationic catalysts that have been tested include iodonium salts and sulfurnium salts. Iodonium salts tested include (1) DPI $CF_3SO_3$—; (2) DPI $F_6PO_4$; (3) DPI Chloride, (4) DPI COO- and (5) DPI $F_6$ Antimonate. Sulfurnium salts that were tested include (1) TPS F6 Antimonate and (2) TPS $F_6PO_4$.

When using a particular secondary amine called NPG, the reaction mechanisms might not involve cationic species, since the cationic species generated from the above salts would be annihilated by the presence of the active hydrogen of the secondary amine. In addition, replacing the amino acids consisting of a secondary amine with a carboxylic or a sulfonic acid compound, a tertiary or secondary amine compound, or with other amino acids consisting of a tertiary amine largely reduces both the sensitivity and the dynamic ranges.

Based on the above results and the fact that only PVP can provide the highest sensitivity and dynamic range, grafting of the carboxylic acid of the secondary amine or the NPG is probably the important contributing factor. It has been reported that carboxylic acid can react with the oxazoline ring of the PVP.

For purposes of the present invention, photoinitiators that have been examined include (1) ITX, (2) BDMK, (3) I369, (4) I184, (5) TPO AND (6) I784. Coinitiators or tertiary amines that have been examined include (1) MDEA, (2) TEA, (3) EDMAB.

III. Photo-Polymerizable Compounds

Photo-polymerizable compounds are selected from mono- and multi- (i.e., di-, tri- and tetra-) functional acrylates with each acrylate exhibits some essential characteristics other than their high reactivity toward photo-polymerization.

A. An acrylate which upon its polymerization will provide a resulting polymer matrix with low (i.e., much less than 25° C.) glass transition temperature, or matrix with high polymer chain mobility to facilitate diffusion of polymerizable compounds. Suitable acrylates should have the following general structure:

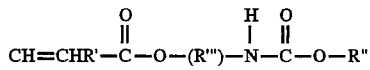

In the above, the R' and R" can be identical or different and is —H or a mono-radicals consisting of an alkyl group. The R'" is an alkyl di-radical. For instance, the R'=H, R'"=—(CH—)2— and R" is —CH (CH3)2 or —(CH2)2CH3.

B. Acrylates can readily diffuse into bright fringes during polymerization. Suitable compounds are diacrylates with molecular weight less than 290 g/Mol, preferably in the ranges between 140 to 240 g/Mol, Diacrylates with excessively low molecular weight are either highly volatile or hazardous. Examples of preferred diacrylates are the following:

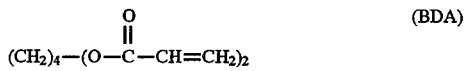

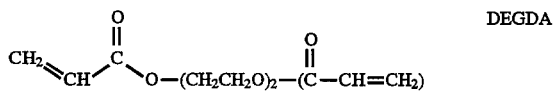

C. Multi-functional acrylates are less likely to diffuse into dark fringes during polymerization. Suitable compounds are acrylates which consist of at least three acrylate groups and have molecular weight more than 250 g/Mol. Examples of these acrylates are TMPTA and TMPTMA as described below.

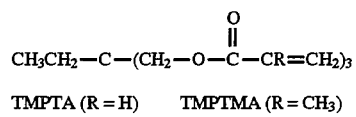

TMPTA (R = H)    TMPTMA (R = CH3)

For achieving the maximum sensitivity and dynamic range, the weight ratios of the above acrylates are found to be in the ranges of (A/B/C)=(0.91 to 0.6)/(0.20 to 0.40)/(0.01 to 0.18).

Acrylates that work well for the present invention include mono-acrylates, diacrylates, and multi-acrylates. Monoacrylates may include (1) n-Butyl methacrylate, (2) Lauryl methacrylate, (3) 4-Hydroxyl butylacrylate, (4) Triflouroethyl methacrylate, (5) Zn monom acrylate and (6) acrylamide. Diacrylates that work well include (1) 1.4 Butane diacrylate, (2) Diethyleglycol diacrylate, (3) Triethyleneglycol diacrylate, and (4) Methylene diacrylamide. Multi-acrylates that have been tested include (1) TMPTA, (2) SR 444, (3) SR 499 and (4) SR494. All available from Satomer Co.

In the presence of all the above polymer carrier and initiating system ingredients, one embodiment of the invention replaced the photo-polymerizable compound with a 50% mixture of a vinyl ether, such as DEV-3 and divinyl hexane ether, and an epoxy such as Epon 828. Using this reactive vinyl ether/epoxy mixture for cationic polymerization, there was no grating formed using an exposure energy exceeding 600 mJ/cm$^2$ of exposure. These experiments demonstrated that under the presence of the secondary amino acids such as NPG, cationic polymerization either might not be possible or is the presence of sulfurnium salts such as S5 alone can be easily polymerized with an energy under 20 mJ/cm$^2$ using UV irradiation.

IV. Other Chemicals

The present invention may also use a promotor for film clarity. Although epoxy does not significantly affect film sensitivity and dynamic range, when films are not covered or sealed from moisture, the epoxy in some formulations prevents hazing under high humidity. If films turn hazy after exposure to high humidity, the noise levels increase drastically. Furthermore, when excess MB is used in some formulations, epoxy can also be used to reduce dye recovery after writing and fixing to the film. The Epon 828 epoxy having the following structure serves these functions quite well.

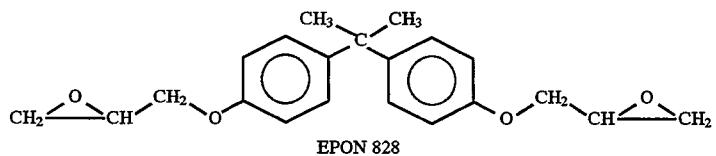

EPON 828

Some chemicals can specifically interact with excited dye and generate reactive species which in turn will scavenge singlet oxygen. An oxygen scavenger is, therefore, used for some formulations to enhance surface cure of the films. Dipheyl Isobenzofuran, which has the following structure, is an effective oxygen scavenger for this purpose:

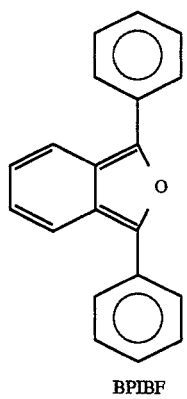

BPIBF

Although the invention has been described in detail herein with reference to the illustrative embodiments, it is to be understood that this description is by way of example only and is not to be construed in a limiting sense. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A solution comprising a photosensitive polymer composition for storing holographic images, wherein said photosensitive polymer composition comprises:

a polymer carrier comprising at least one =N—C(=O)— group;

a polymerizable compound; and an initiation system for photo-polymerizing said polymerizable compound, said initiation system comprising:
a dye; and
a photosensitive initiator comprising an initiator and a photosensitive co-initiator consisting essentially of an amino acid.

2. The solution of claim 1, wherein said polymer carrier consists essentially of poly (2-ethyl-2-oxazoline).

3. The solution of claim 1, wherein said polymer carrier consists essentially of polyvinylpyrrolidone.

4. The solution of claim 1, wherein said initiation system comprises a dye having an absorption range of from 650 to 710 nm.

5. The solution of claim 1, wherein said initiator comprises an initiator selected from the group consisting of I2 and I3.

6. The solution of claim 1, wherein said amino acid comprises at least one of a secondary amine or a tertiary amine.

7. The solution of claim 1, wherein said initiation system further comprises at least one of a carboxylic acid and a sulfonium acid.

8. The solution of claim 1, wherein said initiation system further comprises a cationic photoinitiator selected from the group consisting essentially of triphenyl sulfonium salt and diphenyl iodonium salt.

9. The solution of claim 1, wherein said polymerizable compound comprises a monoacrylate for forming polymers with low glass transition temperature.

10. The solution of claim 1, wherein said polymerizable compound comprises a di-acrylate that exhibits high diffusion rate in said photosensitive polymers.

11. The solution of claim 10, wherein said polymerizable compound comprises a diacrylate comprising a molecular weight of less than approximately 290 g/mol.

12. The solution of claim 10, wherein said polymerizable compound comprises a diacrylate comprising a molecular weight within a molecular weight within the range of 140 to 240 g/mol.

13. The solution of claim 1, wherein said polymerizable compound comprises the multi-acrylate, TMPTA.

14. The solution of claim 1, wherein said polymerizable compound comprises a mixture of approximately 50% vinyl ether and approximately 50% epoxy.

15. The polymerizable compounds of claim 14 have acrylate weight ratios in the (A/B/C) ranges of (0.91 to 0.6)/(0.20 to 0.40)/(0.01 to 0.18).

16. The solution of claim 14, wherein the vinyl ether comprises di-vinyl hexane ether and the epoxy comprises

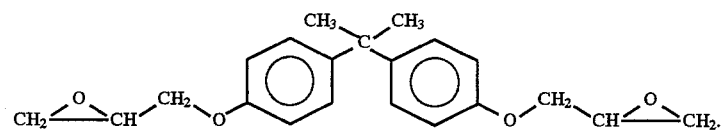

17. The solution of claim 1, wherein said polymerizable compound comprises mono-, di-, and multi-functional acrylates.

18. The solution of claim 1, further comprising an epoxy compound for film clarity.

19. The solution of claim 1, further comprising an oxygen scavenger.

20. The solution of claim 1, wherein the amino acid comprises the following structure:

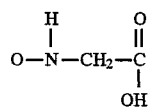

* * * * *